United States Patent [19]

Huscroft et al.

[11] Patent Number: 5,512,860
[45] Date of Patent: Apr. 30, 1996

[54] CLOCK RECOVERY PHASE LOCKED LOOP CONTROL USING CLOCK DIFFERENCE DETECTION AND FORCED LOW FREQUENCY STARTUP

[75] Inventors: Charles K. Huscroft, Coquitlam; Graham B. Smith, Burnaby; Brian D. Gerson, Coquitlam, all of Canada

[73] Assignee: PMC-Sierra, Inc., Burnaby, Canada

[21] Appl. No.: 352,744

[22] Filed: Dec. 2, 1994

[51] Int. Cl.$^6$ .......................... H03L 7/087; H03L 7/095
[52] U.S. Cl. .............. 331/1 A; 331/11; 331/14; 331/25; 331/DIG. 2
[58] Field of Search .................. 331/1 A, 11, 14, 331/25, DIG. 2

[56] References Cited

U.S. PATENT DOCUMENTS 4,365,211  12/1982  Lee ............................................. 331/11
4,688,205   8/1987  Abiko ......................................... 331/11
5,157,355  10/1992  Shikakura et al. ......................... 331/11

*Primary Examiner*—Siegfried H. Grimm
*Attorney, Agent, or Firm*—Pascal & Associates

[57] ABSTRACT

A method of generating output clock pulses using a phase locked loop which includes a voltage controlled oscillator (VCO) is comprised of providing a sequence of data pulses and a sequence of reference clock pulses, resetting the phase locked loop to force the VCO to its lowest operating frequency, releasing reset of the phase locked loop and forcing the VCO to lock to a multiple of the frequency of the reference clock pulses, detecting the presence of data pulse transitions, in the event of detection of data pulse transitions, forcing the VCO to lock to the data pulses, and outputting output clock pulses from the phase locked loop.

14 Claims, 3 Drawing Sheets

CLOCK RECOVERY PHASE LOCKED LOOP CONTROL USING CLOCK DIFFERENCE DETECTION AND FORCED LOW FREQUENCY STARTUP

FIELD OF THE INVENTION

This invention relates to digital transmission systems and in particular to a clock recovery circuit which uses a phase locked loop.

BACKGROUND TO THE INVENTION

False locking occurs when a phase locked loop locks to a frequency other than that of a data stream from which a clock signal is to be recovered. False locking to harmonics (e.g. half or double) of the data stream baud rate sometimes occurs. False locking can also occur at other frequencies which are closer to the baud rate of the data stream. This occurs because a standard phase detector used for recovery of clock from a data stream may not drive a phase locked loop to lock if the phase locked loop voltage controlled oscillator (VCO) and the data stream differ in frequency by more than a small amount. This difference is typically much less than the total frequency range of the VCO. This is normally the case with VCOs that are implemented in very large integrated circuits (VLSI) because such VCOs must have a wide frequency range to ensure that across variations in process, voltage and temperature, the VCO range always encompasses the frequency of data streams from which the clock frequency and phase is to be recovered. A discussion of "false locking" can be found in the paper "The Applications of Linear Servo Theory to the Design of AGC Loops", by W. K Victor in Proceedings of the IRE, Vol 48, February 1960.

Existing systems typically use one of two approaches to avoid false locking. The first approach is to tune or trim the VCO such that its total frequency range is limited and is centered about the frequency of the data stream to be recovered. If the VCO is restricted sufficiently, this ensures that the phase detector is always able to drive the phase locked loop into lock. A disadvantage of this approach is the production cost of tuning or trimming the VCO frequency range. For low cost, highly manufacturable products such an approach is not viable.

The second approach to avoid false locking is to train the phase locked loop using a phase/frequency detector that locks the phase locked loop to a clock (typically provided by a crystal oscillator) that is known to be very closely related to the frequency of the data stream to be recovered. To reduce costs, the reference crystal used is usually an integer submultiple of the data stream baud rate. For example, when recovering 155.56 MHz, a 19.44 MHz reference crystal can be used for training the phase locked loop (which is ⅛ the nominal frequency of the clock to be recovered).

A drawback of this second approach is that it only avoids false locking immediately subsequent to training. If it is ever possible to get into a false locked state at another time, there appears to be no way to detect this state and trigger retraining.

A typical case under which a phase locked loop may drift significantly from its nominal frequency is during a loss of signal event. For example, loss of signal occurs when a cable or fiber carrying the received data stream is cut. To detect loss of signal, many clock recovery phase locked loop circuits incorporate a counter that detects when no receive signal transitions occur over a significant number of bit intervals which form a loss of signal threshold. Upon detection of loss of signal, the phase locked loop may be forced to retrain to the reference.

There may also be transient disturbances on the receive signal path, however, that result in low transition density for a period of time sufficient to allow a phase locked loop to drift, while not violating a simple loss of signal threshold. To address this situation, many clock recovery phase locked loop circuits incorporate logic to monitor the received data stream and detect when unacceptably low transition density events occur and force retraining to the reference. For example, a clock recovery phase locked loop circuit could have logic that declares loss of signal after 80 bit intervals with no transitions and logic that declares low transition density if there are fewer than 8 transitions in a window of 240 bits, and triggers retraining if either event occurs.

While such a circuit may be fairly simple, it suffers from several drawbacks. Firstly, it may be difficult to prove that such an algorithm will detect all low transition density events that are capable of allowing the phase locked loop to drift sufficiently to lead to the false locking problem. Secondly, if a pessimistic algorithm is chosen so as to have higher confidence of detecting all problematic low transition density events, then the performance of the clock recovery phase locked loop will be downgraded by triggering retraining in many cases where retraining is unnecessary. This will result in a loss of synchronization to the received data stream which is typically plesiochronous to the reference.

This is particularly troublesome when dealing with SONET data streams or other data streams that are based on scrambled NRZ line coding. With such line coding the data stream appears much like a random bit stream with 50% average ones density having no limit on the run length of all zeros or all ones data, except that the longer the period without transitions in question, the less likely that it is to occur.

With such scrambled NRZ data, one is motivated to have optimistic loss of signal and low transition density detection algorithms (from the point of view of preventing the false locking problem) so as to not have these algorithms limiting the effective bit error rate performance of the system.

Fundamentally, with such attempts to detect problematic transition density events by examining the incoming data stream, one must implement very complex algorithms or accept significant degradation of the potential performance of the clock recovery phase locked loop in order to have high probability of avoiding the false locking problem.

Finally, there may be situations in which transient disturbances on the receive signal path result in high transition densities but nevertheless allow the clock recovery phase locked loop to drift sufficiently to allow false locking to occur. A typical scenario involves use of simple fiber optic receivers that are optimized for long reach. Such receivers of necessity incorporate automatic gain control so as to detect the lowest incoming light levels possible and may have no squelching circuitry so as to extract the maximum in low light level performance.

Under open fiber situations, however, such receive optics typically will generate essentially noise on their outputs, most likely at frequencies related to system noise on the power supply used by the optical receiver. When the output of such optics are fed to a clock recovery phase locked loop that depends on training to a reference as described, under an open fiber condition the phase locked loop may be driven significantly away from its nominal operating frequency with the result that it will not lock when a proper receive signal is restored, hence leading to the false locking problem.

A clock recovery phase locked loop sometimes reverts to an open loop mode, which is undesirable. Clock recovery is typically used at the receiving end of serial data links within systems. In order to minimize the number of circuits connected, high signal bit rates are typically used. In order to minimize cost, it is desirable to use VLSI device implementation technology of the minimum possible frequency capability that can achieve the required performance.

However, as mentioned earlier, when VCOs are implemented in VLSI devices and trimming is not used, such VCOs must have a wide frequency range to ensure that across variations in process, voltage and temperature, the VCO range always encompasses the frequency of data streams from which clock is to be recovered.

Further, in order to close the control loop around the clock recovery phase locked loop under all conditions, some logic circuitry, typically a divider, must operate at a frequency higher than the upper end of the VCO control range. This puts an onerous constraint on the design of phase locked loop control logic. For example, given typical VCO frequency ranges, when designing a 155 Mbit/s clock recovery circuit, the logic closing the loop must operate above 200 MHz. Similarly, the logic closing the loop for a 622 MHz clock recovery circuit must operate above 800 MHz.

SUMMARY OF THE INVENTION

In accordance with the present invention, a clock recovery method and system are realized which ensures that it can never be fooled into a "false locking" mode, and always lock into a legal (e.g. ±20 ppm from nominal) signal when it is applied, regardless of the type of signal (loss of signal or noise) that was applied prior to the legal signal. This is effected by forcing the VCO of the phase locked loop to lock to a reference signal source if it is not locked to the legal signal.

The present invention also ensures that the VCO of the phase locked loop is initialized at reset to a frequency below its nominal operating frequency, and be trained in an increasing frequency direction from lowest to nominal operating frequency. This avoids ever having to depend on the VCO and its associated phase locked loop closing circuitry operating at the top end of the frequency range of the VCO.

In accordance with an embodiment of the invention, a method of generating output clock pulses using a phase locked loop which includes a voltage controlled oscillator (VCO) is comprised of the steps (a) providing a sequence of data pulses and a sequence of reference clock pulses, (b) resetting the phase locked loop to force the VCO to its lowest operating frequency, (c) releasing reset of the phase locked loop and forcing the VCO to lock to a multiple of the frequency of the reference clock pulses, (d) detecting the presence of data pulse transitions, (e) in the event of detection of data pulse transitions, forcing the VCO to lock to the data pulses, and (f) outputting output clock pulses from the phase locked loop.

In accordance with another embodiment, the step of forcing the VCO to lock to the data pulses further includes (e.1) detecting timing differences between a submultiple of an output signal of the VCO from the sequence of data pulses and the reference clock pulses, and (e.2) in the event a predetermined number of timing differences are detected during a predetermined interval, forcing the VCO to lock to a multiple of the frequency of the reference clock pulses and repeating steps (d), (e), (e.1) and (e.2).

BRIEF INTRODUCTION TO THE DRAWINGS

A better understanding of the invention will be obtained by reading the description of the invention below, with reference to the following drawings, in which:

FIG. 1 is a block diagram of a clock recovery circuit incorporating the present invention, FIG. 2 is a logic diagram of an embodiment of the clock difference detector, and FIG. 3 is a flow chart of the process carried out by the state machine.

DETAILED DESCRIPTION OF THE INVENTION

The preferred embodiment of the clock recovery method and apparatus described below is directed to a clock signal of 622 Mbit/s (or 311 Mbit/s or 155 Mbit/s), as is typically used in a synchronous optical network (SONET) system, although the invention is not restricted thereto.

The basic phase locked loop is comprised of a voltage controlled oscillator (VCO) 1, the output of which is applied to the input of a mode divider 3, the output of which is connected to the input of a phase detector 5, the output of which is connected to the input of the VCO through a loop filter 7. The output of the phase detector is connected to the loop filter through a multiplexer, to be described in more detail below. An input data signal RSD (referred to below as the input data signal) from which the clock is to be recovered is applied to another input of phase detector 5.

Figure 1:
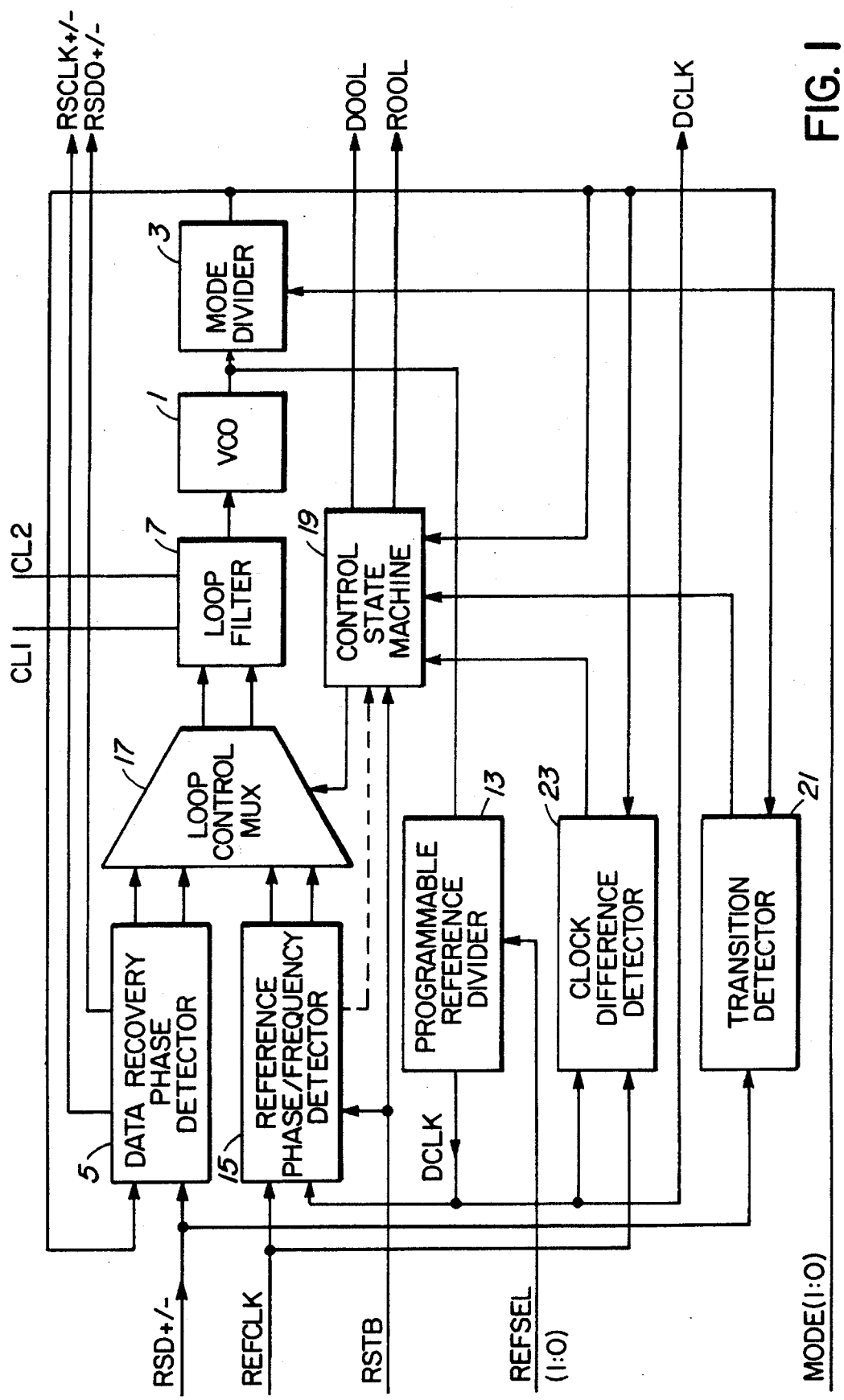

In a successful prototype of the invention, an embodiment of which is shown in FIG. 1, the VCO operates at 622 MHz and should have an operating range sufficiently wide that it will always achieve 622 MHz over process, temperature and voltage variations. The operating frequency of 622 MHz should be its center frequency, and it is preferred to have an operating range of several hundred MHz. It should also be optimized for low intrinsic jitter generation. In a typical system, the maximum operating frequency of the VCO would be less than 900 MHz under all operating conditions.

The mode divider 3 divides the 622 MHz output signal of the VCO by 1, 2, 4 or 12 to produce a 622, 311, 155 or 51 MHz clock that is used for data recovery purposes, and thus for configuring the system for recovery or synthesis of a 622, 311, 155 or 51 MHz clock signal. The divide ratio is selected and controlled externally by a MODE(1:0) control signal applied to a control input of the mode divider, which can select one out of four divide ratios using control bits 11,10,01 or 00.

The loop filter 7 integrates up or down pulses received at its input, to generate a voltage used to control the VCO 1. The loop filter should be designed for low intrinsic jitter generation and to provide a transfer function that permits adequate jitter tolerance during clock recovery and adequate reference jitter attenuation during clock synthesis.

The phase detector 5 is a data recovery phase detector, which generates up or down pulses based on comparisons of the phase of input data transitions of the serial input data stream and transitions in the divided down recovered clock output from the VCO and the mode divider. It should have the characteristic that if the serial data input stream is scrambled (i.e. pseudorandom with 50% ones bit density, and its bit rate is within 122 ppm of the divided down VCO output clock frequency, then the data recovery phase detector should correctly drive the loop filter and the VCO toward a true lock condition.

Recovered clock and data signals RSCLK and RSDO from the phase locked loop are output from the phase detector 5 in a well known manner, e.g. by sampling the serial data stream in the center of its eye and generating phase aligned clock and retimed data outputs RSCLK and RSDO.

General operation of the above circuit is well known. The phase detector 5 detects phase difference between the divided output signal from the VCO and the input data signal, and provides up or down pulses, carried through filter 7, to the VCO, which adjusts its phase or frequency until no further up or down pulses are generated. This basic phase locked loop would suffer from the false locking problem described earlier.

A programmable reference divider 13 receives the 622 MHz output signal from the output of the VCO and divides it by 8, 12, 16 or 32 to produce a 77, 51, 38 or 19 MHz clock signal DCLK. The divide ratio is selected externally by a two bit signal REFSEL(1:0), which is applied to a control input of the divider 13. The divider 13 should produce a 50% duty cycle output signal and should be able to operate well above 622 MHz to ensure that control is maintained over the VCO at all times. Preferably the divider should be designed to operate above the maximum operating frequency of the VCO, which is indicated above to be around 900 MHz. If this is not possible, forced low frequency startup can be used.

A reference phase/frequency detector 15 receives at one input the DCLK output signal of the reference divider 13 and at another input a reference clock signal REFCLK. This detector compares the signals at its inputs, and generates up or down pulses that are fed to the loop filter in place of the pulses output from phase detector 5. These should always drive the VCO to a true lock condition to the reference clock REFCLK, regardless of the operating frequency of the VCO. This detector 15 should be a true phase/frequency detector.

Detector 15 may also contain circuitry to detect an out-of-lock condition, which replicates the phase/frequency detector 15 circuitry but with delays inserted such that there exists a dead band. The purpose of the dead band is to have pulses only generated when the input signals are significantly out of phase alignment. The up and down signals are then logically ORed to create an out of lock signal.

When the system is reset (the reset signal not being shown), the phase/frequency detector 15 is forced to generate down pulses. These pulses are fed to the loop filter 7 where they are integrated, and as a result force the VCO to its lowest frequency.

The output signals from phase detector 5 and phase/frequency detector 15 are applied to inputs of loop control multiplexer 17. Depending on the value of an input signal to its control input C, received from a control state machine 19 to be described below, either the up and down pulses from detector 5 or those from detector 15 pass through and are applied through loop filter 7 to VCO 1.

A transition detector 21 receives the output signal from the mode divider 3 and the input signal RSD, and determines whether the input signal transition density is adequate for clock recovery purposes. The transition detector provides an indication signal to the control state machine 19 if no transitions are present for a preferred interval of 80 bits.

The transition detector can be comprised of a counter which counts successive bit intervals with no transitions, which counter can be a 7 bit counter that counts up to 80 and is reset upon the existence of a transition. The threshold of a count of 80 is preferred since this is the standard loss of signal threshold specified for the SONET standard.

Upon reset, the transition detector indicates that transition density is inadequate, until it completes its processing interval and determines otherwise.

Clock difference detector 23 receives and compares the frequencies of the reference clock signal REFCLK and the output signal DCLK of the reference divider 13. Comparisons should be done over 8192 cycles of the DCLK signal to establish a processing interval. In each such interval, the number of DCLK cycles should be counted. If this count differs by more than 1, it should generate a signal which is applied to the control state machine 19 which indicates that the REFCLK and DCLK signals differ by more than 122 ppm (relative to REFCLK). Otherwise it should generate a signal which is applied to the control state machine 19 which indicates that REFCLK and DCLK differ by 122 ppm or less.

Figure 2:
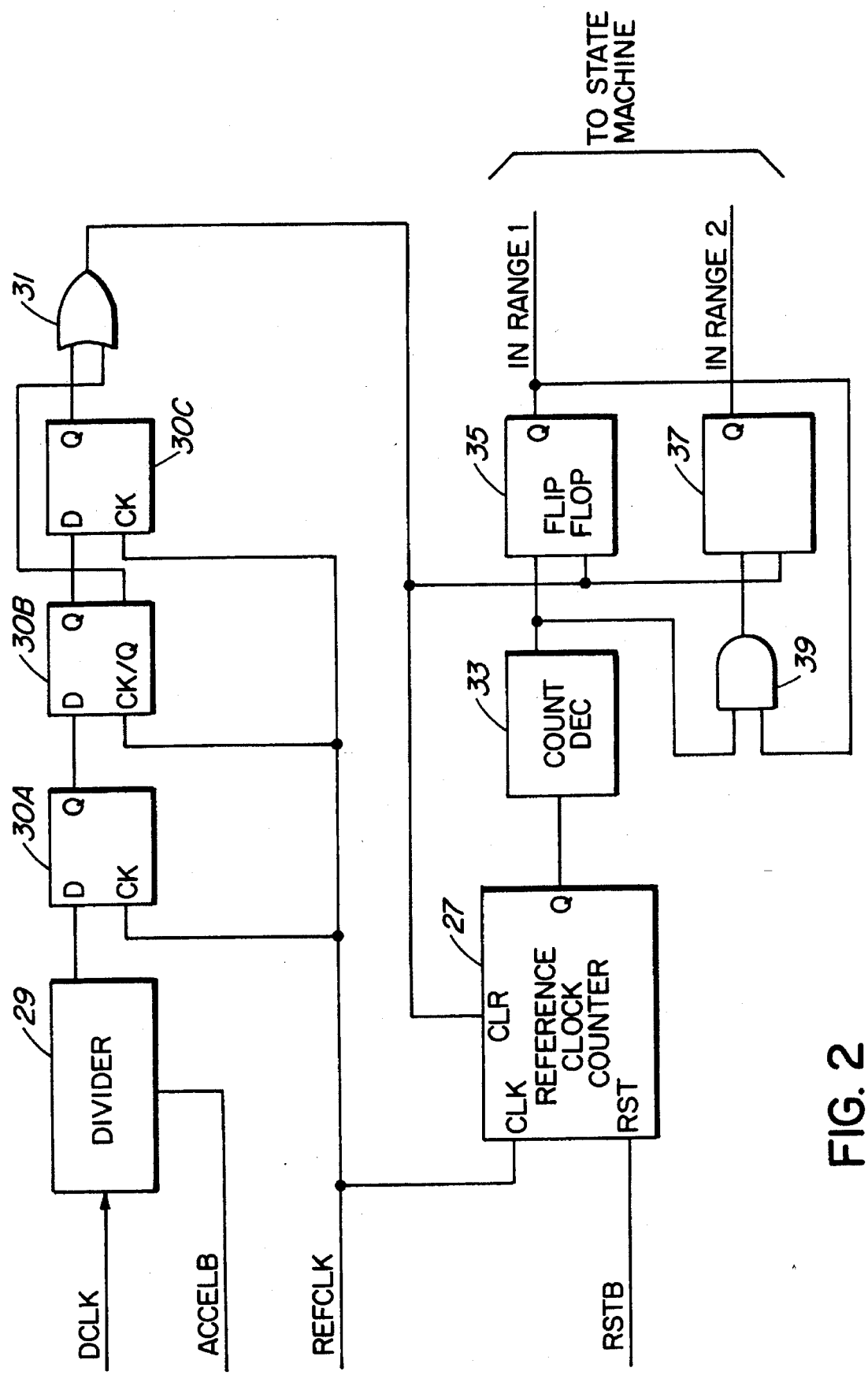

The clock difference detector can be implemented by the circuit illustrated in FIG. 2. Two 13 bit counters are used in an embodiment of the clock difference detector. The signal DCLK is divided by 8192 preferably using a ripple divider 29. Since the divided down signal must be synchronized to REFCLK this asynchronous design practice is safe. Three series connected flip-flops 30A, 30B, 30C and a NOR gate 31 are used for synchronization with REFCLK and to detect the rising edge of the DCLK divider output. The output of the NOR gate is one REFCLK interval wide and occurs once every 8192 DCLK periods. This signal pulse causes sampling of the output of a COUNT_DEC block 33 by flip flop 35 and clears reference clock counter 27.

The reference clock counter 27 is formed by an iterated CNTBIT instance, such as a synchronous binary up counter with clear and scan inputs. If the DCLK and REFCLK clock frequencies are equal the reference counter 27 will count from 0 to 8191. The output of NOR gate 31 synchronization pulse will be aligned to a count of 8191. To allow for movement of the synchronization position due to synchronization slips and slight frequency differences, the synchronization pulse can also be aligned to a reference count of 8190 or 0. The COUNT_DEC block declares the DCLK and REFCLK frequencies to be "IN RANGE" when the reference count at the synchronization position is 8190, 8191, 0 (nominal count ±1) Since the reference counter 27 is cleared at the beginning of each integration interval the clock frequency difference must result in a nominal count ±2 to be detected as out of range. Due to synchronization errors, an out of range frequency difference is first detected when the clock frequency difference is greater than one part in 8192 or 112 ppm.

The two flip flops 35 and 37 and an AND gate 39 are used to hold the "IN RANGE" state between integration interval sampling points and to detect if the reference count has been in range for two consecutive integration intervals. If the reference count is out of range for even one integration interval both INRANGE1 and INRANGE2" outputs are deactivated.

An acceleration mode can be provided to make functional simulations practical. When the ACCELB input pin is active low, the DCLK ripple counter 29 is tapped at the ninth bit position and the "IN RANGE" count values are changed to 510,511 and 0. The integration period is thus reduced to 512 DCLK cycles.

To allow for high fault coverage testing of the gates inside the COUNT_DEC block 33, a scan test chain can be added to the reference counter. The reference counter state can be easily controlled via a serially shifted in pattern. This is useful since a set of walking one and walking zero patterns is required to detect all the "stuck at pin" faults inside the COUNT_DEC block 33.

In a successful prototype, after the analog VCO voltage stabilized as determined by the charge pump average current and loop filter components, at least two integration periods were required to enter the "Locked to Data" state. These integration periods are summarized in the following table:

| Reference Frequency | Two Integration Periods |
|---|---|
| 19.44 MHz | 843 us |
| 38.88 MHz | 421 us |
| 51.84 MHz | 316 us |
| 77.76 MHz | 210 us |

Control state machine 19 determines whether clock is recovered from the input data or is synthesized from the reference clock, and controls the loop control multiplexer 17. The control state machine receives the reset signal RSTB, a signal from the reference phase/frequency detector 15, a control signal from the transition detector 21 and a control signal from the clock difference detector, and generates state machine signals as described below. It also synchronizes the release of reset. Its inputs are considered to be synchronous to the high speed clock provided by the mode divider, which also clocks the control state machine.

The clock difference detector could alternatively be comprised of a 13 bit counter which counts 8191 DCLK cycles and then rolls over. In this embodiment, at the beginning of each interval, the up/down counter should be reset to 0. Input REFCLK and DCLK signals are monitored. On each rising REFCLK edge, the up/down counter should be incremented. On each rising DCLK edge, the up/down counter should be decremented. Simultaneous rising edges should result in the up/down counter remaining at its previous value. At the end of each interval, the output of the up/down counter should be sampled and then reset to 0 to begin the next processing interval. If the up/down counter is in a state other than 0, +1 or −1, then a clock difference should be flagged.

The interval of 8192 cycles is used in this embodiment because when the aforenoted clock difference is detected, this indicates that the DCLK and REFCLK signals differ by more than 112 ppm.

Upon reset the clock difference detector will indicate that a clock difference exists, until it successfully completes a processing interval which determines otherwise.

Figure 3:
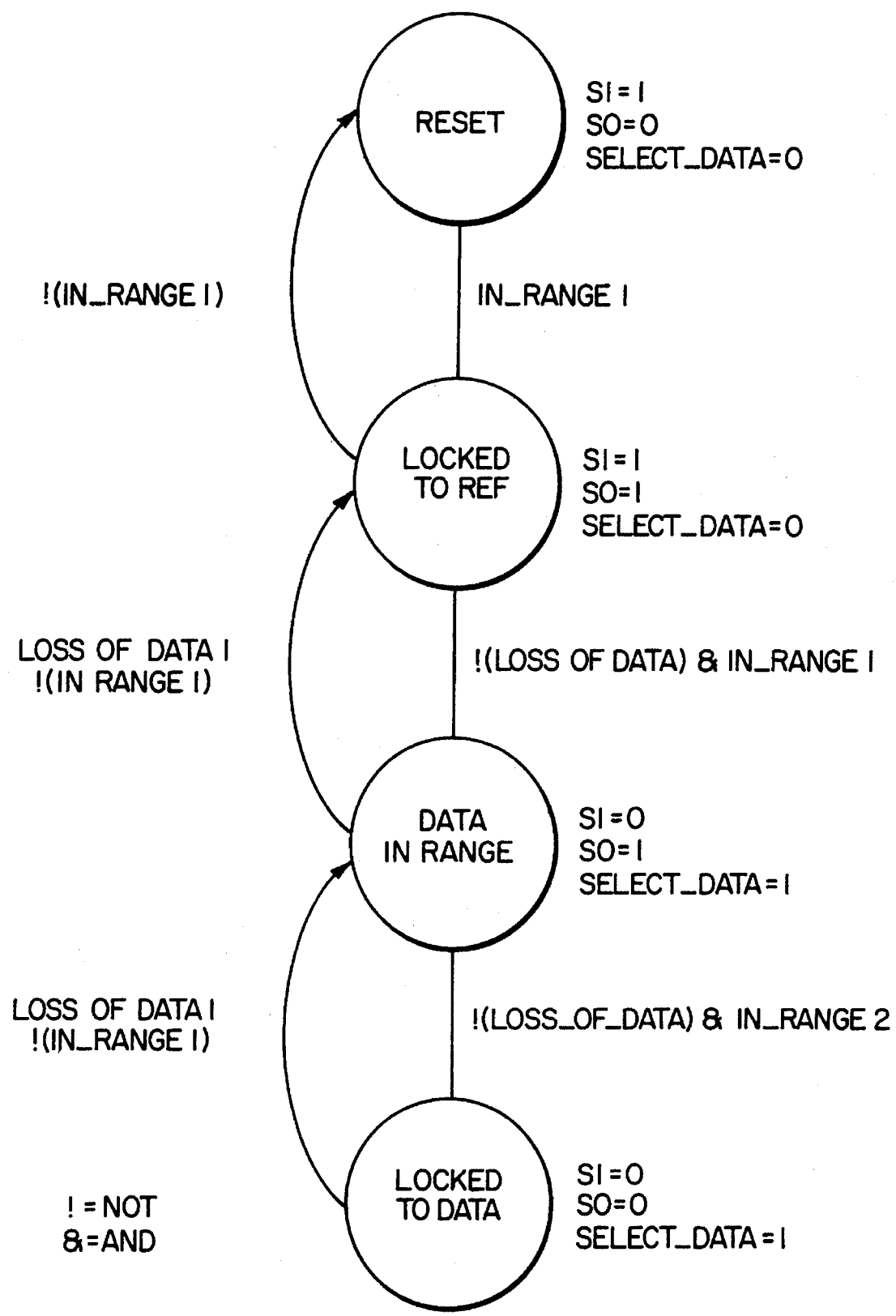

With reference to the flow chart shown in FIG. 3, the four states of the control state machine are 10 (reset), 11 (locked to reference), 01 (training to data) and 00 (locked to data).

Upon release of reset, the control state machine enters its reset state. In this state the loop control multiplexer forces the VCO 1 to be controlled from the output of the reference phase/frequency detector 15. The VCO is driven until it becomes locked to the appropriate multiple of the reference frequency. This may be detected by the reference phase/frequency detector which notifies the control state machine by the INRANGE1 or INRANGE2. These signals are synchronous with the reference clock that is provided to the control state machine. The control state machine then declares the circuit to be locked to reference. This occurs when the divided down VCO clock and the reference clock input differ in frequency by less than 122 ppm, as determined by the clock difference detector 23. The control state machine enters the locked to reference state.

If sufficient data transitions are present on the input data, and the frequency difference remains in range, then the control state machine should enter the training to data state (looking for data). Once in this state the loop control multiplexer is switched by the control state machine to apply the output of the phase detector 5 to the VCO 1 through loop filter 7, forcing the VCO to be controlled by the output of the data phase detector 5.

At this point the clock difference detector is enabled to determine if lock is achieved. Once several clock difference detector processing intervals are completed, if a clock difference is not detected, the control state machine declares the circuit to be locked to data.

In order to enter the locked to data state, there must be sufficient data transitions present and the clock difference must be within range for a second integration period to ensure that the data recovery loop has stabilized. Once in the locked to data state the data recovered from the RSDO and the RSCLK outputs may be considered valid.

If the clock difference detector finds a difference, or if the transition detector indicates loss of signal (80 bit intervals without a transition), then the control state machine should toggle the loop control multiplexer 17 forcing the VCO to be controlled by the reference phase/frequency detector. The control state machine is also forced to be out of lock to data and out of lock to reference, and the process begins again as if the circuit had just been released from reset.

In the event sufficient data transitions are lost, the control state machine should transition back to the locked to reference state, and wait for data transitions to be restored. In the event the continually monitored clock difference goes out of range due to a false lock condition, the control state machine will transition back to the reset state and begin again the entire process of locking to the reference clock input signal, as described above.

The clock difference detector constrains the VCO to a narrow range of frequencies about the appropriate multiple of the reference frequency. In this example where the boundary is ±112 ppm, this allows the use of a low cost, readily available reference crystal oscillator to generate the REFCLK signal. Accuracy of ±100 ppm is a readily achievable crystal oscillator tolerance.

For SONET applications in which the present invention can be used, compliant SONET data streams must operate at a ±20 ppm accuracy. Thus any deviation of ±112 ppm from a reference accuracy to ±100 ppm or better is a clear indication that a legal SONET signal is not present. With such an offending signal, the clock recovery circuit described herein will toggle between locked to reference and looking for data, while maintaining essentially a "keep alive" clock output for downstream circuitry which never deviates more than ±112 ppm from the reference.

As alternatives to the above-described embodiment, a lock detect circuit could be used to determine when it is locked to reference. As another alternative, the clock difference detector can be used to check for lock to reference in a manner analogous to using the clock difference detector to check for lock to data.

Either the REFCLK or DCLK can be used as the timebase for implementing the processing interval of the clock difference detector. When implementing the counters which integrate the clock difference, small saturating counters could be used (which do not truly indicate the clock difference if significant jitter and wander is present on the REFCLK or DCLK signals due to information being lost when the counters saturate). Alternatively, longer counters can be used which perform integrations that are accurate under all situations. Further, a longer processing interval or different counter thresholds so as to constrain the maximum allowable clock difference to be less than or greater than ±112 ppm can be chosen for the implementation.

A person understanding this invention may now conceive of alternative structures and embodiments or variations of the above. All of those which fall within the scope of the claims appended hereto are considered to be part of the present invention.

We claim:

1. A method of generating output clock pulses using a phase locked loop which includes a voltage controlled oscillator (VCO) comprising:

(a) providing a sequence of data pulses and a sequence of reference clock pulses, (b) resetting the phase locked loop to force the VCO to its lowest operating frequency, (c) releasing reset of the phase locked loop and forcing the VCO to lock to a multiple of the frequency of the reference clock pulses, (d) detecting the presence of data pulse transitions, (e) in the event of detection of data pulse transitions, forcing the VCO to lock to the data pulses, and (f) outputting output clock pulses from the phase locked loop.

2. A method as defined in claim 1 in which the step of forcing the VCO to lock to the data pulses further includes (e.1) detecting timing differences between a submultiple of an output signal of the VCO from the sequence of data pulses and the reference clock pulses, and (e.2) in the event a predetermined number of timing differences are detected during a predetermined interval, forcing the VCO to lock to a multiple of the frequency of the reference clock pulses and repeating steps (d), (e), (e.1) and (e.2).

3. A method as defined in claim 2 in which step (e.1) is carried out by (i) dividing the submultiple of the output signal of the VCO to provide a divided submultiple signal, (ii) synchronizing the divided submultiple signal with the reference clock pulses, (iii) counting reference clock pulses in a reference clock counter, (iv) providing a signal pulse over one clock interval of the reference clock pulses once each divided submultiple signal occurrence, (v) storing the count of the reference clock counter in a further counter, (vi) clearing the reference clock counter with the signal pulse, (vii) sampling the further counter with the signal pulse, and (viii) carrying out step (e.2) in the event the state of the further counter is other than a divisor used in step (i) for dividing the submultiple of the output signal of the VCO, within a predetermined tolerance, or 0.

4. A method as defined in claim 3 in which the divisor is 8192 and said state of the further counter within the predetermined tolerance is 8190 or 8191 or 0.

5. A method as defined in claim 2 in which step (e.1) is carried out by detecting rising edges of the reference clock pulses and the submultiple of an output signal of the VCO, incrementing an up/down counter on each rising edge of the reference clock pulses, decrementing the up/down counter on each rising edge of said submultiple signal, sampling the up/down counter following said predetermined interval and resetting the up/down counter, and carrying out step (e.2) in the event the state of the up/down counter is other than 0, +1 or −1.

6. A method as defined in claim 5 in which the predetermined interval is the time for 8192 cycles of the submultiple of the output signal of the VCO.

7. Apparatus for generating output clock pulses using a phase locked loop which includes a voltage controlled oscillator (VCO) comprising:

(a) means for providing a sequence of data pulses and a sequence of reference clock pulses, (b) means for resetting the phase locked loop to force the VCO to its lowest operating frequency, (c) means for releasing reset of the phase locked loop and forcing the VCO to lock to a multiple of the frequency of the reference clock pulses, (d) means for detecting the presence of transitions of the data pulses, (e) means for forcing the VCO to lock to the data pulses in the event of detection of data pulse transitions, and (f) means for outputting output clock pulses from the phase locked loop.

8. Apparatus as defined in claim 7 in which said means for forcing the VCO to lock to the data pulses further includes (e.1) means for detecting timing differences between a submultiple of an output signal of the VCO from the sequence of data pulses and the reference clock pulses, and (e.2) means for forcing the VCO to lock to a multiple of the frequency of the reference clock pulses in the event a predetermined number of timing differences are detected during a predetermined interval, and for operating repeatedly the (d), (e), (e.1) and (e.2) means.

9. Apparatus as defined in claim 8 in which the (e.1) means comprises:

(i) means for dividing the submultiple of the output signal of the VCO to provide a divided submultiple signal, (ii) means for synchronizing the divided submultiple signal with the reference clock pulses, (iii) means for counting reference clock pulses in a reference clock counter, (iv) means for providing a signal pulse over one clock interval of the reference clock pulses once each divided submultiple signal occurrence, (v) means for storing the count of the reference clock counter in a further counter, (vi) means for clearing the reference clock counter with the signal pulse, (vii) means for sampling the further counter with the signal pulse, and (viii) means for operating the (e.2) means in the event the state of the further counter is other than a divisor used in the (i) means for dividing the submultiple of the output signal of the VCO, within a predetermined tolerance, or 0.

10. Apparatus as defined in claim 9 in which the divisor is 8192 and said state of the further counter within the predetermined tolerance is 8190 or 8191 or 0.

11. Apparatus as defined in claim 8 in which the (e.1) means is comprised of means for detecting rising edges of the reference clock pulses and the submultiple of an output signal of the VCO, means for incrementing an up/down counter on each rising edge of the reference clock pulses and for decrementing the up/down counter on each rising edge of said submultiple signal, means for sampling the up/down counter following said predetermined interval and for resetting the up/down counter, and in the event the state of the up/down counter is other than 0, +1 or −1, forcing the VCO to lock to a multiple of the frequency of the reference clock pulses in the event a predetermined number of timing differences are detected during a predetermined interval and for operating repeatedly the (d), (e), (e.1) and (e.2) means.

12. Apparatus as defined in claim 11 in which the predetermined interval is the time for 8192 cycles of the submultiple of the output signal of the VCO.

13. A clock recovery circuit comprising:
   (a) a digital phase locked loop including, in series, a voltage controlled oscillator, a mode divider connected to the output of the oscillator, a first phase detector connected to the output of the mode divider and a loop filter for receiving an output signal of the phase detector and providing an output signal to the oscillator,
   (b) means for applying a digital input signal to another input of the phase detector, whereby the phase detector provides an output signal representing the phase difference between the digital input signal and an output signal of the mode divider,
   (c) a reference clock signal input,
   (d) a second phase detector for receiving the reference clock signal at an input thereof,
   (e) a reference divider for receiving an output signal of the oscillator and for generating a DCLK signal,
   (f) means for applying the DCLK signal to another input of the second phase detector,
   (g) a clock difference detector for receiving the DCLK signal, the reference clock signal and an output signal of the mode divider and for generating an out-of-range signal in the event the DCLK and reference clock signals differ by a predetermined number of pulses from the output of the mode divider,
   (h) a multiplexer for passing an output signal of either of the phase detectors to the loop filter,
   (i) a state machine for receiving the out-of-range signal and for controlling the multiplexer to pass the output signal of the second phase detector to the loop filter in the event of the presence of an out-of-range signal, and to pass the output signal of the first phase detector to the loop filter in the absence of the out-of-range signal.

14. A clock recovery circuit as defined in claim 13, further including a transition detector for receiving the digital input signal and the output of the mode divider, for determining the transition density of the digital input signal and for providing an indication signal to the state machine indicating that the transition density of the digital input signal is sufficient for clock recovery, the state machine thereby controlling the multiplexer to pass the output signal of the second phase detector in the absence of said indication signal even in the absence of receiving an out-of-range signal, and in the presence of said indication signal and the absence of the out-of-range signal controlling the multiplexer to pass the output signal of the first phase detector.

* * * * *